US009236120B2

(12) United States Patent  
Papandreou et al.

(10) Patent No.: US 9,236,120 B2  
(45) Date of Patent: Jan. 12, 2016

(54) READ MEASUREMENT OF RESISTIVE MEMORY CELLS

(71) Applicant: International Business Machines Corporation, Armonk, NY (US)

(72) Inventors: Nikolaos Papandreou, Rueschlikon (CH); Charalampos Pozidis, Rueschlikon (CH); Abu Sebastian, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/899,092

(22) Filed: May 21, 2013

(65) Prior Publication Data

US 2013/0322156 A1 Dec. 5, 2013

(30) Foreign Application Priority Data

May 30, 2012 (GB) .................................. 1209594.9

(51) Int. Cl.
*G11C 13/00* (2006.01)
*G11C 11/56* (2006.01)

(52) U.S. Cl.
CPC ............ *G11C 13/0021* (2013.01); *G11C 11/56* (2013.01); *G11C 11/5678* (2013.01); *G11C 13/004* (2013.01); *G11C 2013/0045* (2013.01); *G11C 2013/0057* (2013.01)

(58) Field of Classification Search
CPC .................. G11C 11/5678; G11C 13/0004
USPC .......... 365/148, 163, 171, 185, 189, 194, 233
See application file for complete search history.

(56) References Cited

U.S. PATENT DOCUMENTS

| 7,535,756 | B2* | 5/2009 | Lung .............................. 365/163 |
| 7,885,101 | B2 | 2/2011 | Bedeschi et al. |
| 7,940,552 | B2 | 5/2011 | Chang-Wook et al. |
| 2003/0043631 | A1 | 3/2003 | Gilton et al. |
| 2010/0067285 | A1 | 3/2010 | Lung et al. |
| 2010/0110785 | A1 | 5/2010 | Chen et al. |
| 2010/0165712 | A1* | 7/2010 | Bedeschi et al. .............. 365/163 |

(Continued)

FOREIGN PATENT DOCUMENTS

| CN | 102122525 A | 7/2011 |
| KR | 20070024803 A | 3/2007 |

(Continued)

OTHER PUBLICATIONS

S. Hudgens and B. Johnson (2004). Overview of Phase-Change Chalcogenide Nonvolatile Memory Technology. MRS Bulletin, 29, pp. 829-832. doi:10.1557/mrs2004.236.*

(Continued)

*Primary Examiner* — Shawki S Ismail  
*Assistant Examiner* — Muhammad S Islam  
(74) *Attorney, Agent, or Firm* — Cantor Colburn LLP

(57) ABSTRACT

A method for read measurement of resistive memory cells having $s \geq 2$ programmable cell-states includes applying to each cell at least one initial voltage and making a measurement indicative of cell current due to the initial voltage; determining a read voltage for the cell in dependence on the measurement; applying the read voltage to the cell; making a read measurement indicative of cell current due to the read voltage; and outputting a cell-state metric dependent on the read measurement; wherein the read voltages for cells are determined in such a manner that the cell-state metric exhibits a desired property.

15 Claims, 8 Drawing Sheets

(56) References Cited

U.S. PATENT DOCUMENTS

| | | | |
|---|---|---|---|
| 2010/0177552 A1 | 7/2010 | Huang et al. | |
| 2010/0214830 A1 | 8/2010 | Franceschini et al. | |
| 2011/0051508 A1* | 3/2011 | Eleftheriou et al. | 365/163 |
| 2011/0096594 A1 | 4/2011 | Franceschini et al. | |
| 2011/0242884 A1 | 10/2011 | Eleftheriou et al. | |
| 2011/0242887 A1 | 10/2011 | Parkinson | |
| 2012/0092923 A1 | 4/2012 | Bedeschi et al. | |
| 2012/0230097 A1 | 9/2012 | Frey et al. | |
| 2012/0307554 A1 | 12/2012 | Frey et al. | |
| 2012/0327709 A1 | 12/2012 | Frey et al. | |
| 2013/0135924 A1* | 5/2013 | Pantazi et al. | 365/163 |

FOREIGN PATENT DOCUMENTS

| | | |
|---|---|---|
| WO | 2012029007 A1 | 3/2012 |
| WO | 2012120401 A1 | 9/2012 |

OTHER PUBLICATIONS

"calculate." Merriam-Webster.com. 2014. http://www.merriam-webster.com (Nov. 3, 2014).*

Kim, et al.,"Improved Endurance of Resistive Switching TiO2 Thin Film by Hourglass Shaped Magneli Filaments," Applied Physics Letters, vol. 98 , Issue: 26, Jun. 2011, pp. 1-4.

A. Sebastian, et al.,"Non-Resistance-based Cell-State Metric for Phase-change Memory," Journal of Applied Physics 110, 084505, 2011, pp. 1-6.

Shanshan Peng, et al., "Mechanism for Resistive Switching in an Oxide-Based Electrochemical Metallization Memory," Applied Physics Letters, 100, 072101, 2012, pp. 1-4.

UK Intellectual Property Office; Application No: GB1209594.9; Patents Act 1977: Search Report under Section 17(5); Mailed: Sep. 26, 2012, pp. 1-4.

* cited by examiner

READ MEASUREMENT OF RESISTIVE MEMORY CELLS

PRIORITY

This application claims priority to Great Britain Patent Application No. 1209594.9, filed May 30, 2012, and all the benefits accruing therefrom under 35 U.S.C. §119, the contents of which in its entirety are herein incorporated by reference.

BACKGROUND

This invention relates generally to read measurement of resistive memory cells to obtain a cell-state metric for use in cell-state detection during read operations and/or cell programming during write operations. Read measurement methods and apparatus are provided, together with memory devices and cell-state detection and programming methods which employ the read measurement technique.

In resistive memory, the fundamental storage unit (referred to generally herein as the "cell") can be programmed to any one of $s \geq 2$ different states, or levels, which exhibit different electrical resistance characteristics. The s programmable cell-states can be used to represent different data values, whereby data can be recorded in the cells. When reading recorded data, cell-state is detected from measurements on the cells by exploiting the differing resistance characteristics to differentiate between the s possible cell-states. Some resistive memory devices currently offer only single-bit storage. These devices use so-called "single-level cells" which have $s=2$ programmable cell-states, providing storage of one bit per cell. To increase storage density, however, there is an increasing move toward multibit operation. Multibit memory uses so-called "multilevel" cells which have $s>2$ programmable cell-states, providing storage of more than one bit per cell.

The class of memory technologies collectively known as resistive random access memory (RRAM) provides a promising example of resistive memory. RRAM has the potential to serve as the "universal memory" that blurs the distinction between storage and memory and can address the growing gap in performance between storage and the rest of a computing system. This will tremendously speed up computers and enable future exascale computing systems. RRAM encompasses various memory technologies including phase change memory (PCM), conductive bridge RAM, and valence change memory. In these technologies, the resistance characteristics of cells are modified via structural and electronic changes of tiny nanoscale volumes of chalcogenides and metal oxides upon application of electrical signals.

In general, resistive memory cells are programmed to different cell-states by the application of current or voltage signals. Read measurements on cells are usually performed by biasing the cell with a fixed read voltage and measuring the resulting current flowing through the cell. The cell current at a fixed read voltage depends on electrical resistance of the cell and hence on cell-state, whereby the resulting fixed-voltage resistance measurement provides an effective cell-state metric. A sufficiently low read voltage is used for this resistance metric to ensure that application of the read voltage does not disturb the programmed cell-state. When the read measurement is performed during a data read operation, the resulting resistance metric is used to detect which of the s possible cell-states each cell is programmed to. Cell-state detection can be performed by comparing the resistance metric for each cell with predetermined reference levels defining the s programmable cell-states. Read measurement can also be performed to check cell-state during write operations. For multilevel cells in particular, programming is usually achieved by means of an iterative write-and-verify scheme involving applying a series of programming pulses, with read measurement after each pulse, so as to converge on the desired cell-state.

The conventional low-field resistance metric has several drawbacks. In the case of PCM, the most significant one is resistance drift whereby the resistance of programmed cell states tends to drift upwardly with time, causing errors in cell-state detection. To counter this, some alternate cell-state metrics have been proposed for PCM. In International Patent Application publication no. WO2012/029007, a metric dependent on slope of the current/voltage characteristic of cells is derived from measurements at a plurality of predetermined read voltages. Another approach is described in "Non-resistance-based Cell-State Metric for Phase Change Memory", Sebastian et al., Journal of Applied Physics, vol. 110, pp. 084505, 2011 and our copending European Patent Applications numbers 11157698.9 and 11157709.4, filed 10 Mar. 2011. The read voltage is progressively increased until a predefined current threshold is reached, the time taken to reach this threshold providing a time-based metric for cell-state. In spite of their drift tolerance, these approaches can result in reduced signal margin and/or reduced read bandwidth. RRAM technologies other than PCM, on the other hand, commonly suffer from large variability of the high-resistance state, effectively reducing the signal margin.

U.S. Pat. No. 7,885,101 discloses a cell-state detection system for data read operations on N-state PCM cells. The system performs N-1 read measurements, progressing through a series of predetermined read voltages which are fixed for all cells, and compares the cell-current with a predetermined threshold current at each read voltage. The process stops for a given cell when the cell-current is less than the threshold current, this point being determinative of cell-state, i.e., which of the N possible states the cell is programmed to. This is specifically a cell-state detection system, and is not concerned with production of a cell-state metric per se.

There are still distinct advantages in using electrical resistance as a cell-state metric, especially for memory applications where latency is at a premium. Advantages include the simplicity of the read measurement circuitry and the high read bandwidth. It would be desirable, however, to alleviate the drawbacks associated with the conventional resistance metric as discussed above.

SUMMARY

In one embodiment, a method for read measurement of resistive memory cells having $s \geq 2$ programmable cell-states includes applying to each cell at least one initial voltage and making a measurement indicative of cell current due to the initial voltage; determining a read voltage for the cell in dependence on the measurement; applying the read voltage to the cell; making a read measurement indicative of cell current due to the read voltage; and outputting a cell-state metric dependent on the read measurement; wherein the read voltages for cells are determined in such a manner that the cell-state metric exhibits a desired property.

In another embodiment, a method for read measurement of resistive memory cells having $s \geq 2$ programmable cell-states includes applying to each cell at least one initial current and making a measurement indicative of cell voltage due to the initial current; determining a read current for the cell in dependence on the measurement; applying the read current to the cell; making a read measurement indicative of cell voltage due to the read current; and outputting a cell-state metric dependent on the read measurement; wherein the read currents for cells are determined in such a manner that the cell-state metric exhibits a desired property.

In another embodiment, an apparatus for read measurement of resistive memory cells having s≥2 programmable cell-states includes a voltage generator configured to apply a voltage to a cell; a measurement circuit configured to make a measurement indicative of cell current; and a controller configured to control operation of the apparatus such that the voltage generator applies to each cell at least one initial voltage and the measurement circuit makes a measurement indicative of cell current due to the initial voltage, the controller determines a read voltage for the cell in dependence on the measurement, the voltage generator applies the read voltage to the cell, the measurement circuit makes a read measurement indicative of cell current due to the read voltage, and the controller outputs a cell-state metric dependent on the read measurement; wherein the controller is adapted to determine the read voltages for cells in such a manner that the cell-state metric exhibits a desired property.

BRIEF DESCRIPTION OF THE SEVERAL VIEWS OF THE DRAWINGS

Exemplary embodiments of the invention will now be described, by way of example, with reference to the accompanying drawings in which.

DETAILED DESCRIPTION

Figure 1:
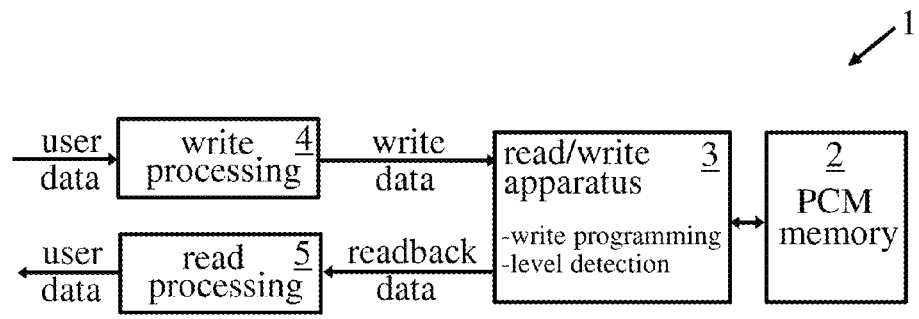
FIG. 1 is a schematic block diagram of a memory device in accordance with an embodiment.

One embodiment of an aspect of the present invention provides a method for read measurement of resistive memory cells having s≥2 programmable cell-states, the method comprising: applying to each cell at least one initial voltage and making a measurement indicative of cell current due to the initial voltage; determining a read voltage for the cell in dependence on the measurement; applying the read voltage to the cell; making a read measurement indicative of cell current due to the read voltage; and outputting a cell-state metric dependent on the read measurement; wherein the read voltages for cells are determined in such a manner that the cell-state metric exhibits a desired property.

In methods embodying this invention, at least one initial voltage is applied to each cell before application of the read voltage itself. A measurement indicative of cell current is made at the (or each) initial voltage. An appropriate read voltage for the cell is then determined based on the results of these initial measurement(s). A read measurement, indicative of cell current at the read voltage, is then made and used to determine the cell-state metric. For example, the read measurement per se may be output as the cell-state metric. This metric is a resistance metric. However, unlike the conventional resistance metric, this metric is not obtained at a fixed read voltage. Since the initial measurements depend on cell-state, the read voltages used for cells are dependent on actual cell-state whereby different read voltages will be used for different cells when generating the cell-state metric. These read voltages are determined in such a manner that the resulting cell-state metric exhibits a desired property. Thus, the resistance metric is effectively tuned to advantageous effect by varying the read voltages for cells based on initial measurements of cell-state. This elegantly simple technique allows advantages of the conventional resistance metric to be retained while inhibiting problems associated with that metric. Tuning of the metric can provide various advantages described below, and can be used in particular to counter the problems of drift and/or small effective dynamic range associated with use of the prior metric.

In general in embodiments of the invention, a measurement indicative of cell current $I_c$ (and hence resistance R) may determine $I_C$ or R per se or some value dependent thereon, e.g., some function thereof such as log $I_C$ or log R. In some embodiments, the read measurement may be output as the cell-state metric. In other embodiments, the cell-state metric may be dependent on the read measurement and the initial measurement(s). In any case, the cell-state metric resulting from the read measurement provides a measure of the actual state of a cell. If the read measurement is performed during readback of data, the metric can be output to a cell-state detector for level-detection, i.e., detecting which of the s possible cell-states the cell is programmed to. Some embodiments may therefore include the step of detecting the programmed cell-state for each cell in dependence on the cell-state metric. Alternatively, or in addition, the read measurement may be performed as part of a write-and-verify (WAV) programming operation, the cell-state metric being output to the programming controller which controls the programming pulses accordingly. An embodiment of a second aspect of the invention therefore provides an iterative programming method for resistive memory cells having s≥2 programmable cell-states, wherein read measurement of the cells during programming is performed by a method according to the first aspect of the invention.

The read voltages for cells can be determined in such a manner that the cell-state metric provides a desired programming curve, e.g., to enhance the programming window. The programming curve is defined by the particular distribution of read measurement (metric) values for cells over the set of s cell-states, or "levels", and the range of these values spanned by the s levels defines the programming window. (For a number of reasons, the distribution of read measurement values may vary between actual programming and read operations so that, strictly speaking, one can consider both a programming window and a read window. For simplicity, however, the term "programming window" is used herein to mean "programming and/or read window" unless the context requires otherwise). A larger range of values (larger programming window) gives more "space" for the s levels, enhancing the programming and read margin for storage and thus increasing dynamic range. This is particularly beneficial for multilevel storage where there are more levels which must be accurately differentiated. In exemplary embodiments, therefore, the read voltages for cells are determined in such a manner the cell-state metric provides an enlarged programming window. More particularly, the metric provides a larger programming window than that for a measurement indicative of cell current due to the initial voltage. The latter metric is essentially a conventional resistance metric, corresponding to a fixed voltage, here the initial voltage, for all cells.

By appropriate definition of the read voltages, the cell-state metric can also provide a programming curve having a desired shape. The particular arrangement and/or spacing of particular levels can be tailored as required, whether or not the overall programming window is increased. This can be used, for instance to increase the separation of specific levels which may cause detection problems, e.g., levels which tend to converge when subject to drift. In effect, therefore, the programming curve can be tuned as desired to improve signal margins and/or counter effects of drift. Moreover, in some embodiments, the read voltages can be determined such that the cell-state metric effectively compensates for the drift of cell-states. This is discussed further below.

In exemplary embodiments the read voltage is calculated as a predetermined function of the initial measurement(s). While a number of different initial voltages could be used for initial measurements, in simple embodiments a single initial voltage is applied to the cell. A single measurement may then be made indicative of cell current due to the initial voltage, and the read voltage determined from this single measurement. This provides a particularly simple two-step read measurement system.

While it is generally desirable to derive the metric by applying voltages to cells and measuring current, the opposite approach can be envisaged. Thus, an embodiment of a third aspect of the invention provides a method for read measurement of resistive memory cells having s≥2 programmable cell-states. The method comprises: applying to each cell at least one initial current and making a measurement indicative of cell voltage due to the initial current; determining a read current for the cell in dependence on the measurement; applying the read current to the cell; making a read measurement indicative of cell voltage due to the read current; and outputting a cell-state metric dependent on the read measurement; wherein the read currents for cells are determined in such a manner that the cell-state metric exhibits a desired property.

An embodiment of a fourth aspect of the invention provides apparatus for read measurement of resistive memory cells having s≥2 programmable cell-states. The apparatus comprises a voltage generator for applying a voltage to a cell, a measurement circuit for making a measurement indicative of cell current, and a controller for controlling operation of the apparatus such that: the voltage generator applies to each cell at least one initial voltage and the measurement circuit makes a measurement indicative of cell current due to the initial voltage; the controller determines a read voltage for the cell in dependence on the measurement; the voltage generator applies the read voltage to the cell; the measurement circuit makes a read measurement indicative of cell current due to the read voltage; and the controller outputs a cell-state metric dependent on the read measurement; wherein the controller is adapted to determine the read voltages for cells in such a manner that the cell-state metric exhibits a desired property.

An embodiment of a fifth aspect of the invention provides apparatus for read measurement of resistive memory cells having s≥2 programmable cell-states. The apparatus comprises a current generator for applying a current to a cell, a measurement circuit for making a measurement indicative of cell voltage, and a controller for controlling operation of the apparatus such that: the current generator applies to each cell at least one initial current and the measurement circuit makes a measurement indicative of cell voltage due to the initial current; the controller determines a read current for the cell in dependence on the measurement; the current generator applies the read current to the cell; the measurement circuit makes a read measurement indicative of cell voltage due to the read current; and the controller outputs a cell-state metric dependent on the read measurement; wherein the controller is adapted to determine the read currents for cells in such a manner that the cell-state metric exhibits a desired property.

An embodiment of a sixth aspect of the invention provides a resistive memory device comprising: memory comprising a plurality of resistive memory cells having s≥2 programmable cell-states; and read/write apparatus for reading and writing data in the resistive memory cells, wherein the read/write apparatus includes read measurement apparatus according to the fourth or fifth aspects of the invention.

In general, where features are described herein with reference to an embodiment of one aspect of the invention, corresponding features may be provided in embodiments of another aspect of the invention.

FIG. 1 is a simplified schematic of a resistive memory device embodying the invention. The device 1 includes phase-change memory 2 for storing data in one or more integrated arrays of multilevel PCM cells. Though shown as a single block in the figure, in general memory 2 may comprise any desired configuration of PCM storage units ranging, for example, from a single chip or die to a plurality of storage banks each containing multiple packages of storage chips. Reading and writing of data to memory 2 is performed by read/write apparatus 3. Apparatus 3 comprises circuitry for programming PCM cells during data write operations and for detecting cell-state (level detection) during read operations. During these operations, read/write apparatus 3 can address individual PCM cells by applying appropriate control signals to an array of word and bit lines in memory ensemble 2. This process is performed in generally known manner except as detailed hereinafter. As indicated by block 4 in the figure, user data input to device 1 is typically subjected to some form of write-processing, such as coding for error-correction purposes, before being supplied as write data to apparatus 3. Similarly, readback data output by apparatus 3 is generally processed by a read-processing module 5, e.g., for codeword detection and error correction, to recover the original input user data.

A write operation in device 1 involves programming a multilevel cell into one of its s>2 programmable cell-states. A read operation involves detecting which of these s states, or levels, the cell is set to. In both write and read operations, read measurements are performed on cells to obtain a cell-state metric which provides a measure of the actual state of the cell. The s programmable cell-states defined for multilevel operation may be defined in terms of predetermined reference values, or ranges of values, of the cell-state metric output by the read measurement operation. In a data read operation, the programmed state (level) of a cell can be detected by comparing the metric output by the read measurement operation with the predetermined reference values for the cell levels. Cell-programming can be performed by an iterative WAV operation using a sequence of programming pulses. Read measurement is performed after each pulse in the sequence, and the amplitude of the next pulse is adjusted based on the metric output by the read measurement, until the desired programmed cell-state is achieved.

Figure 2:
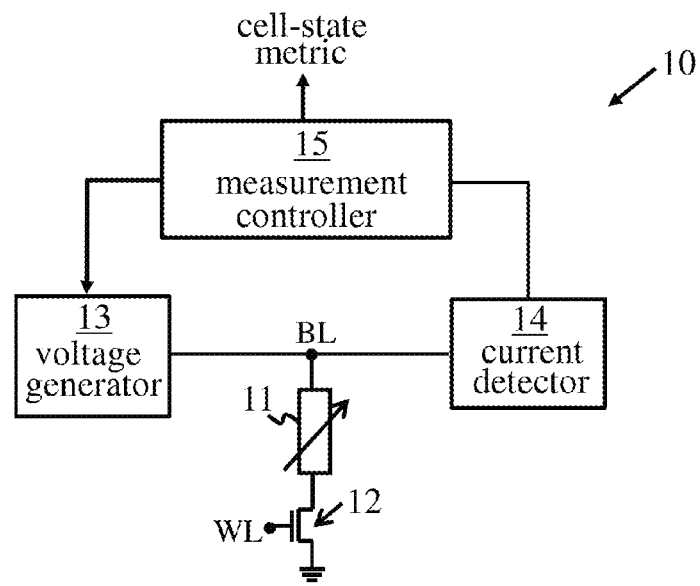
FIG. 2 is a schematic block diagram of read measurement apparatus in the memory device of FIG. 1.

FIG. 2 is a schematic block diagram of read measurement apparatus included in read/write apparatus 3 for read measurement of memory cells. The read measurement apparatus 10 is shown connected to a PCM cell 11, represented as a variable resistance in the figure, for a measurement operation. A particular cell is accessed for this operation via voltages applied to the appropriate word-line WL and bit-line BL for that cell. An access device, here field-effect transistor (FET) 12, is connected in series with cell 11 for controlling access to the cell. The gate of FET 12 is connected to the word-line WL whereby application of a word-line voltage switches on FET 12, allowing current to flow in cell 11. The read measurement apparatus 10 includes a bias voltage generator 13 for applying a bias voltage $V_{BL}$ to the cell bit-line BL. The apparatus 10 also includes a measurement circuit, here a current detector 14, for making a measurement indicative of current flowing through the cell due to the bit-line voltage $V_{BL}$. A measurement controller 15 comprises control logic for controlling operation of the measurement apparatus 10. The measurement controller 15 receives the output of current detector 14 and controls operation of voltage generator 13 to implement a read measurement technique described below. The cell-state metric resulting from a read measurement is output by measurement controller 15, either to a programming controller of the write apparatus during a write operation, or to cell-state detection circuitry for level detection during data readback. The functionality of controller 15 can be implemented in hardware or software or a combination thereof, though use of hardwired logic circuits is generally desired for reasons of operating speed. Suitable implementations for this and the circuit components 13, 14 will be readily apparent to those skilled in the art from the description herein.

Figure 3:
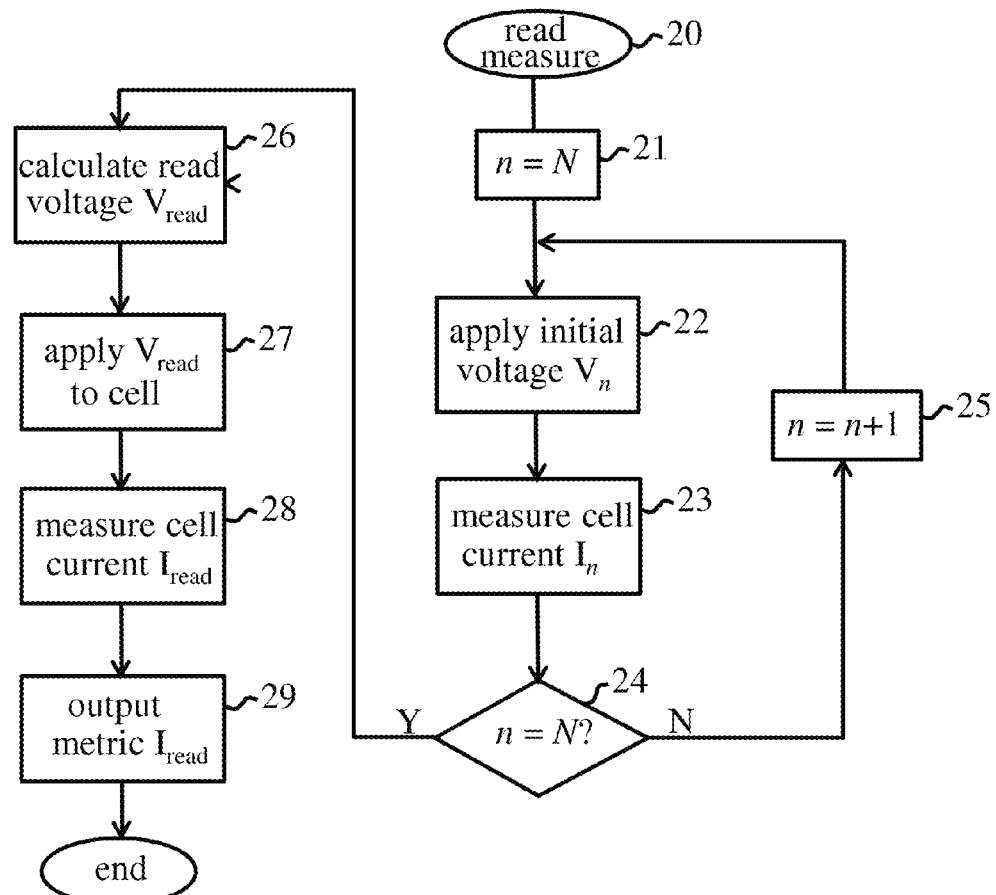
FIG. 3 is a flow diagram illustrating operation of the read measurement apparatus in accordance with an embodiment.

The general operation of measurement apparatus 10 is indicated in the flow chart of FIG. 3. The read measurement operation begins at step 20 and a loop counter n is initialized in step 21. In step 22, measurement controller 15 controls voltage generator to apply a predetermined initial voltage $V_{BL}=V_i$ to the bit line of cell 11. The resulting cell current $I_1$ is measured by current detector 14 in step 23 and output to measurement controller 15. Controller 15 then checks if the loop count has reached a predetermined value N. If not ("No" at decision step 24), then the count is incremented in step 25 and operation reverts to step 22 for a further initial measurement at initial voltage $V_{BL}=V_2$. This process continues until the loop count n =N at decision step 24 ("Yes" at step 24). Operation then proceeds to step 26 wherein controller 15 determines an appropriate read voltage for the cell in dependence on the results of the measurements at initial voltages $V_n$, n=1 to N. This operation is performed in such a manner that the cell-state metric resulting from read measurements exhibits a desired property as discussed below. In step 27, the read voltage $V_{read}$ so determined for the cell is then applied to the cell bit-line by voltage generator 13. The resulting cell current $I_{read}$, measured by current detector 14 in step 28, constitutes the read measurement for the cell. This read measurement $I_{read}$ is supplied to measurement controller 15. In this embodiment, the read measurement $I_{read}$ is simply output by controller 15 as the cell-state metric. The measurement process is then complete.

Figure 4:
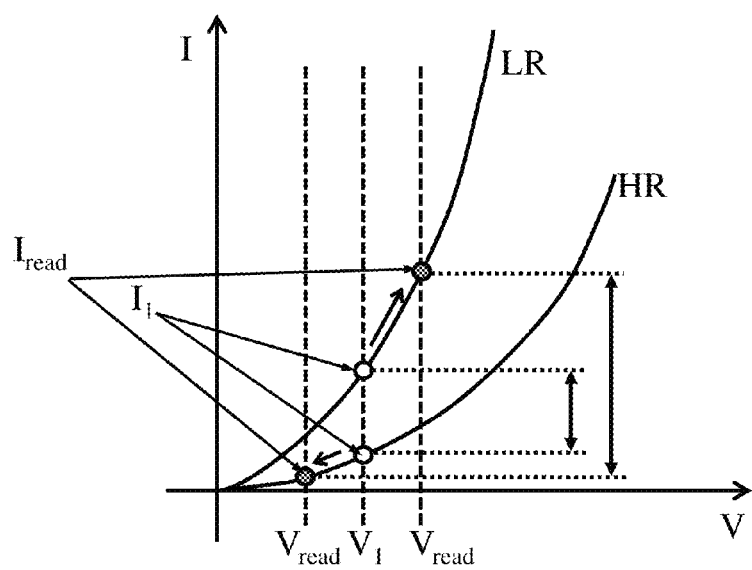
FIG. 4 is a graph illustrating operation of the read measurement system in a simple two-state scenario.

It will be seen that the read measurement operation involves a preliminary stage in which, depending on the value of N, at least one initial measurement is made on the cell. The measured cell-current from each initial measurement is then used to determine an appropriate read voltage for the cell, and the cell current at this read voltage provides the output cell-state metric. Since the read voltages for cells depend on the initial measurements and hence on actual cell-state, different read voltages will be used for different cells when generating the cell-state metric. Hence, measurement controller 15 effectively implements a feedback scheme whereby read voltages for cells are determined by feedback based on initial measurements of cell-state. The feedback scheme for determining the read voltages can be designed such that the resulting resistance metric exhibits a desired property. For example, the feedback scheme can be designed to provide a desired programming curve. FIG. 4 gives a simple illustration of how an exemplary feedback scheme can provide an enlarged programming window compared to the conventional resistance metric. This figure shows characteristic current/voltage curves for two programmed cell states of PCM cells. Each state corresponds to a different thickness of the amorphous phase of the chalcogenide material in the cell, this thickness being varied during programming to set the different cell-states. The low resistance state is labeled LR and the high resistance state is labeled HR. With these cell-states, application of an initial voltage $V_1$ in apparatus 10 would result in a read voltage $I_1$ having one of two values as indicated depending on the particular state of the cell in question. Other values $V_n$ (n=2, . . . , N) of the initial voltage would similarly result in one of two current measurements $I_n$. The read voltage can be calculated as a function of the initial measurement(s), e.g., via:

$$V_{read}=V_N+f(I_1, I_2, \ldots I_N) \qquad (1)$$

where the function $f$ is selected such that the read voltages for the high and low resistance states differ as indicated in the figure. These read voltages result in read measurements $I_{read}$ for the two states which are further apart than those for a fixed voltage measurement at initial voltage $V_1$ for example. The programming window with $I_{read}$ as the cell-state metric is therefore enlarged compared to that for the conventional resistance metric $I_1$ as indicated by the vertical arrows in the figure. Indeed, by exploiting the non-linearity inherent in the I/V characteristics for resistive memory cells, the feedback-enhanced resistance metric of this technique can significantly enhance the programming window.

Figure 5:
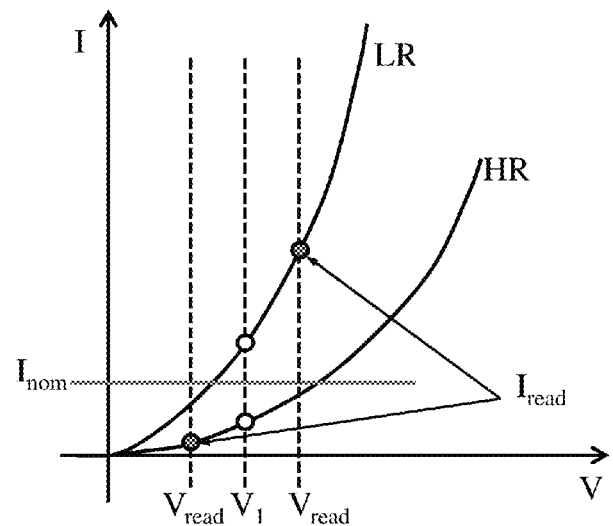
FIG. 5 is a graph illustrating operation of the read measurement system in an exemplary embodiment.

An example of one implementation of the read measurement system is illustrated in FIG. 5 for the simple two-state scenario used in FIG. 4. This embodiment makes a single initial measurement at an initial voltage $V_1$. The read voltage $V_{read}$ is then determined based on difference between the resulting current measurement $I_1$ and a predetermined reference value, here reference current $I_{nom}$. In general, the read voltages might depend on this difference directly or indirectly, e.g., based on straightforward subtraction of two values or after processing the values in some way, e.g., taking a logarithm. In this particular example, the read voltage is determined from the initial voltage and the difference via:

$$V_{read}=V_1+\beta(\log(I_1)-\log(I_{nom})) \qquad (2)$$

With positive values of the parameter $\beta$, this provides a positive feedback system for increasing the programming window as already described. Latency is reduced with only a single initial measurement at voltage $V_1$, providing a simple two-stage system for generating the feedback-enhanced resistance metric.

Figure 6:
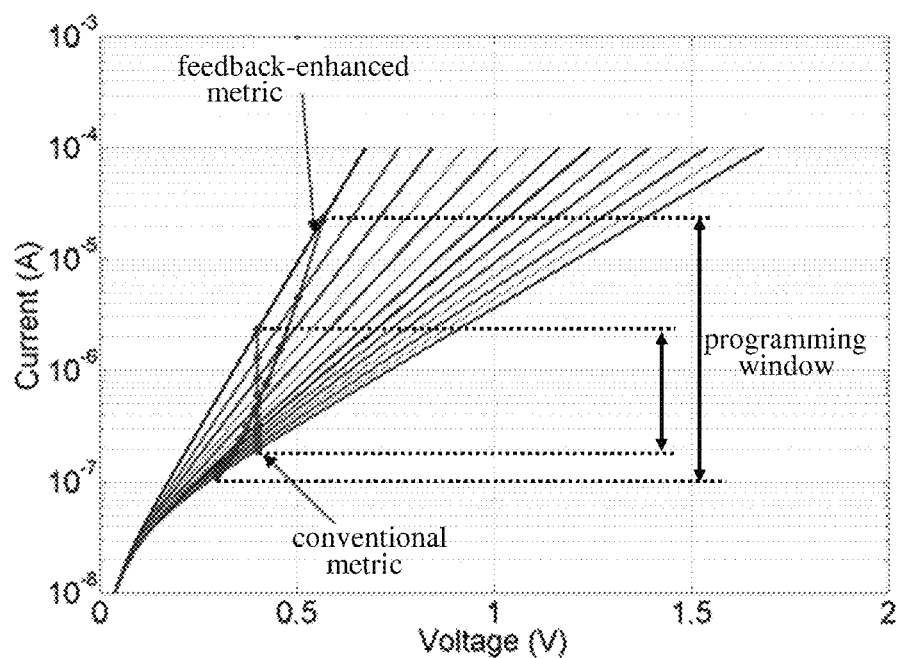
FIG. 6 illustrates the cell-state metric resulting from the FIG. 5 system with multilevel memory cells.
Figures 7A, 7B:
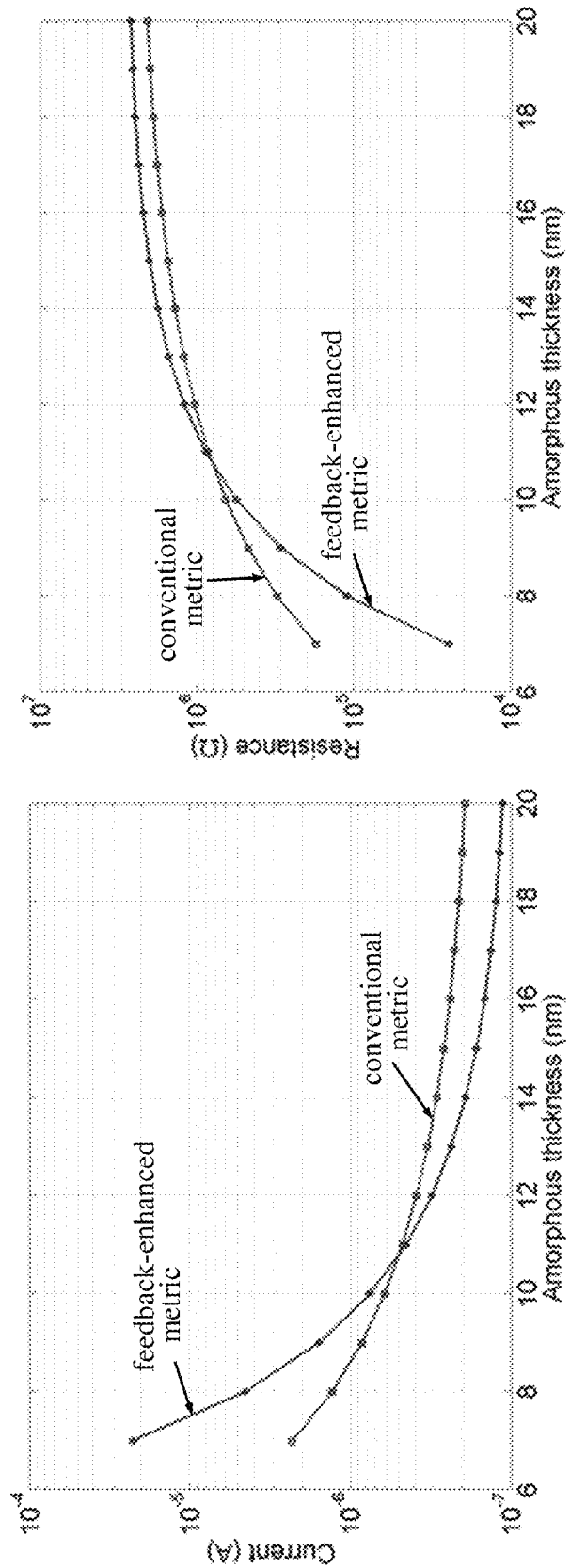
FIGS. 7A and 7B show enhancement of the programming window with the metric of FIG. 6.

While FIGS. 4 and 5 illustrate operation in relation to two cell-states for simplicity, it will be appreciated that the system applies equally to s>2 states. FIG. 6 illustrates simulation results for multilevel PCM cells with s=14 levels, indicating the feedback-enhanced metric of FIG. 5 in comparison to the conventional resistance metric at initial voltage $V_1$. FIGS. 7A and 7B plot read current and resistance respectively against amorphous thickness for the 14-level PCM cells, each figure comparing results for the feedback-enhanced read measurement of FIG. 5 with conventional read measurement at $V_1$.

These figures demonstrate significantly enhanced programming window for both current and resistance measurements.

By adjusting parameters of the feedback scheme for determining the read voltages, the programming curve can be modified in various ways. In general, by appropriate design of the feedback scheme, the programming curve can be tuned as desired. The arrangement and/or spacing of some or all cell-levels, as measured with the feedback-enhanced metric, can be adjusted to shape the programming curve and facilitate distinguishing between levels, e.g., to increase separation of levels which are particularly vulnerable to drift effects.

Figure 8A:
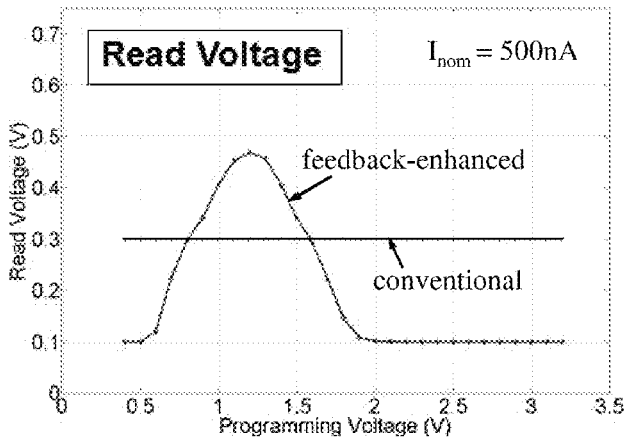
FIGS. 8A to 8C illustrate read measurements obtained in an exemplary implementation of the FIG. 5 system.
Figure 8B:
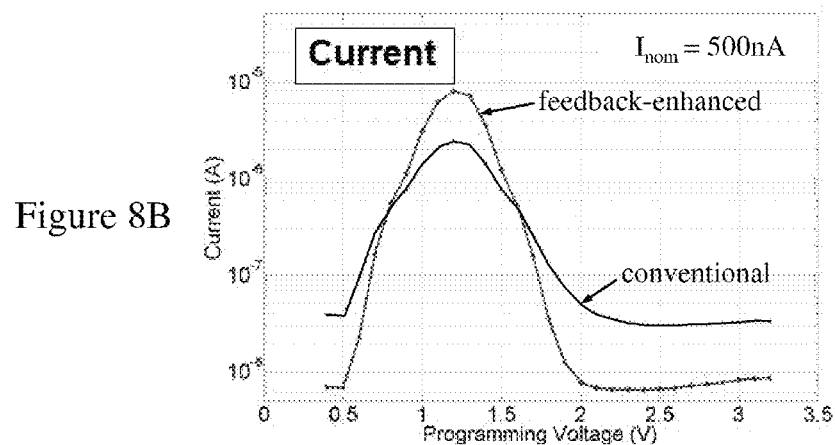
Figure 8C:
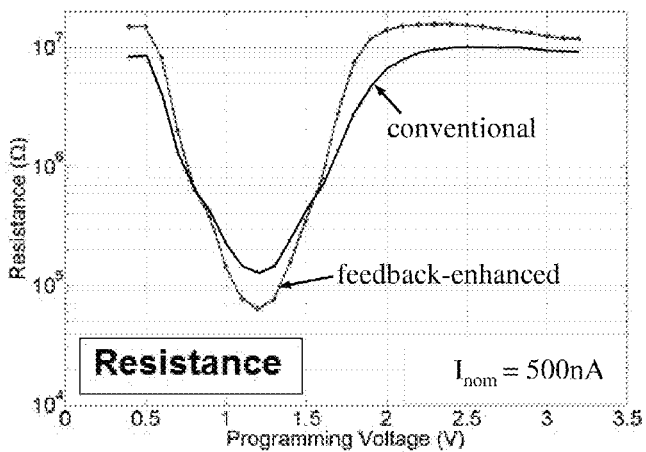
Figure 9A:
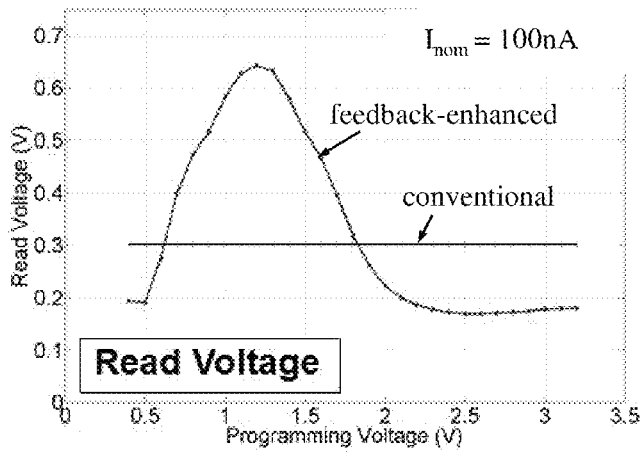
FIGS. 9A to 9C and 10A to 10C illustrate read measurements corresponding to FIGS. 8A to 8C with different values of a threshold current.
Figure 9B:
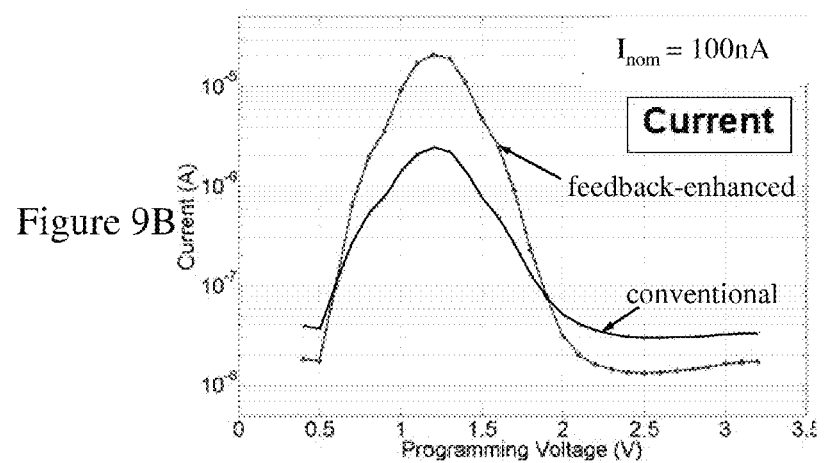
Figure 9C:
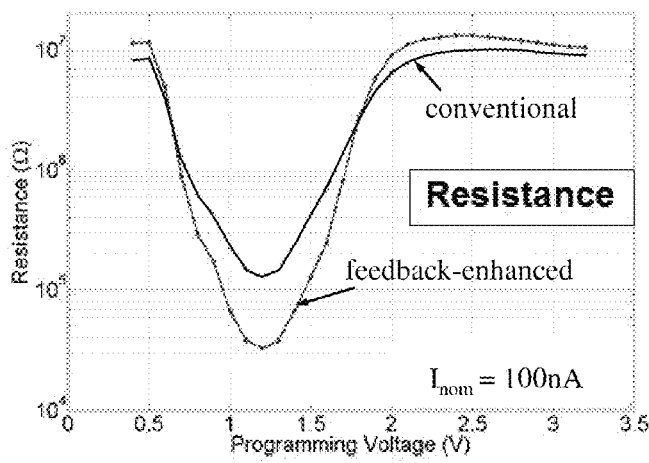
Figure 10A:
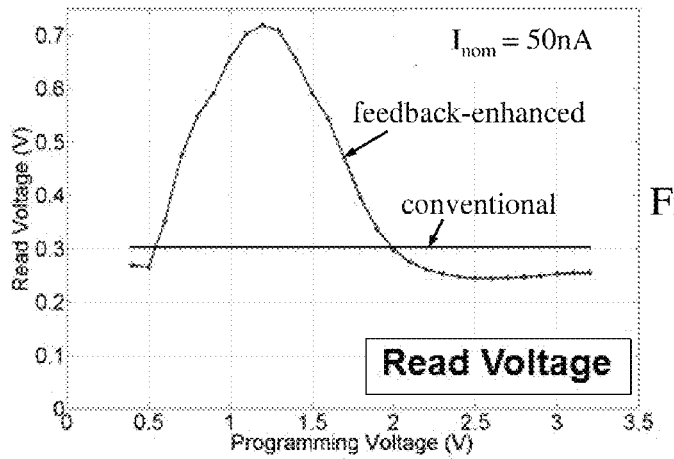
Figure 10B:
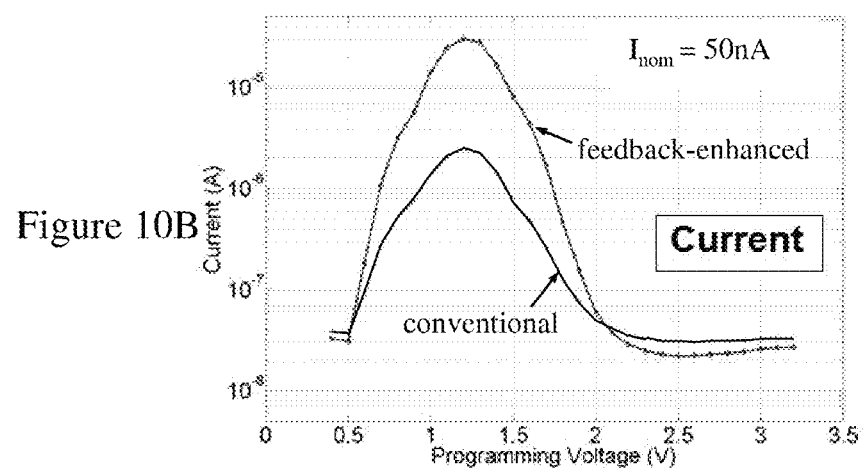
Figure 10C:
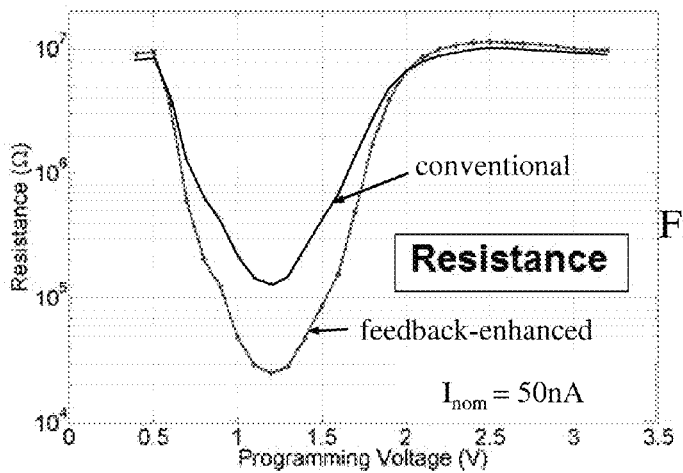

FIGS. 8A to 10C illustrate effects of varying the reference current value $I_{nom}$ in the system described above. FIGS. 8A to 8C illustrate experimental results for the read measurement system of FIG. 5 based on average measurements from 100 PCM cells. The figures respectively plot read voltage $V_{read}$, read current $I_{read}$, and measured resistance R against cell programming voltage (which determines amorphous thickness and hence cell-state). Each figure compares the results for the feedback-enhanced system described above with those for conventional fixed-voltage read measurement at V1. The results in these figures were obtained with parameter values $I_{nom}$=500 nA and $\beta$=0.25. There is a significant impact on the programming window with gain in both the low resistance/high current and high resistance/low current directions. FIGS. 9A to 9C show the corresponding results with modified reference current value $I_{nom}$=100 nA. Here there is more gain in the low resistance/high current regime. FIGS. 10A to 10C show the corresponding results with $I_{nom}$=50 nA, where almost all the gain is in the low resistance/high current regime.

Figure 11A:
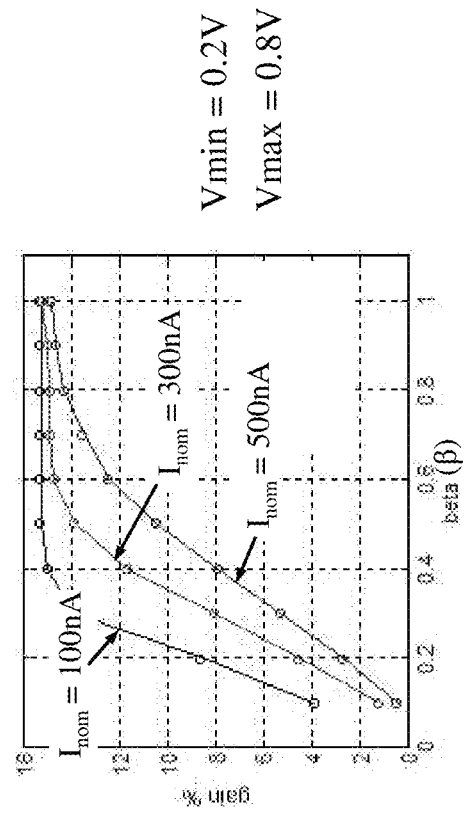
FIGS. 11A and 11B illustrate results for read measurement systems with different parameter values.
Figure 11B:
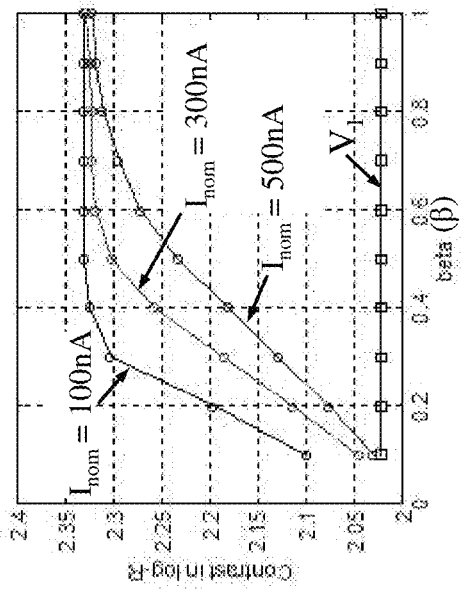

The significant advantages of the feedback-enhanced scheme can be maintained even if there are practical limitations on the range of read voltages used in the system. FIGS. 11A and 11B show experimental results with a variety of parameter values and a limited range of read voltages between a minimum of 0.2V and a maximum of 0.8V. FIG. 11A plots programming window height (measured as the difference between the minimum and maximum (log) resistance values over the programming curve) against the value of parameter $\beta$ for three different values of the reference current $I_{nom}$. The flat trace in this figure represents the conventional readback system at fixed voltage $V_1$. FIG. 11b plots the corresponding percentage-gain in programming window compared to the conventional system. In general, fine tuning of parameters can lead to maximum gain under different constraints.

It will be seen that the above read measurement system provides a significantly-improved cell-state metric, offering expansion of the programming window in both directions as well as tuning of other characteristics such as drift. The programming curve can be tuned with immense flexibility simply by varying parameters of the feedback scheme for determining the read voltages. The system retains advantages of the resistance metric, i.e., circuit simplicity and high read bandwidth, while providing enhanced signal dynamic range, increasing the programming and read margin available for multi-level storage.

In general, the read measurement scheme can be employed in data read operations and/or data programming operations in memory devices embodying the invention. In some embodiments, for example, the feedback-enhanced metric may be used for only one of data readback and iterative programming, with the conventional metric being used for the other.

In a modification to the system described above, read voltages may be calculated in a generally similar manner to the FIG. 5 system but using negative values of the parameter $\beta$. This effectively provides a negative feedback scheme which can be used to compensate (wholly or partially) for drift in (some or all) cell levels. In particular, the effect of drift is generally to cause cell levels, as shown in FIG. 6 for instance, to drift towards higher resistance values. The effect can be level-dependent, affecting some levels more than others. By appropriate selection of parameters in a negative feedback scheme, the read voltages can be caused generally to follow drifting levels, countering the reduction in level separation which tends to result from drift.

While the cell-state metric in the above embodiment is the read measurement $I_{read}$ per se, in other embodiments the cell-state metric may be some function of the read measurement. In particular, embodiments can be envisaged in which the cell-state metric is dependent on the read measurement and the initial measurement(s). By way of example, in a system involving an initial measurement at a voltage $V_1$ from which a read voltage $V_{read}$ is determined, e.g., as in equation (2) above, an alternative cell-state metric M could be calculated as:

$$M=((\log(I_{read})-\log(I_1))(V_{read}-V_1) \qquad (3)$$

Various other functions may of course be envisaged for the cell-state metric.

While voltage-mode read operations, involving application of bias voltages and sensing of cell current, are generally desirable, current-mode read measurement can be envisaged. In this case, the read measurement scheme operates substantially as described but involves application of a current to the cell and measuring the resulting cell voltage. In a modification of FIG. 2, for example, a particular current can be caused to flow in the cell by applying a fixed bias voltage $V_{BL}$ and using the voltage generator to control the word-line voltage at the gate of access device 12. The voltage generator and access device then effectively provide a current generator for applying a desired current to the cell. The voltage dropped across cell 11 due to this cell current would then be measured by the measurement circuit and supplied to the measurement controller. The final read current would be determined based on one or more initial measurements as before, with the resulting cell-voltage providing the read measurement for obtaining the cell-state metric. Such current-mode measurement may provide less performance improvement than the voltage mode read system but may still be employed to advantage in some memory devices.

Various other modifications can be envisaged. For example, while a single initial measurement may be desirable for latency reasons, a plurality of initial measurements could be made by applying a single initial voltage more than once, the average measurement then being used to calculate $V_{read}$. If a plurality of different initial voltages are used in the initial measurements, each initial voltage could be calculated from the measurement for the previous voltage, e.g., via an equation similar to that for the system of FIG. 5. Embodiments might also be envisaged where the read voltage is selected from a set of predefined voltages in dependence on the initial measurement(s). It is desirable, however, that the read voltage is calculated as a function of the initial measurement(s) as in the embodiments above, providing improved flexibility and avoiding the need for predefined voltage levels.

It will be appreciated that many other changes and modifications can be made to the exemplary embodiments described without departing from the scope of the invention.

The invention claimed is:

1. A method for read measurement of resistive memory cells having s≥2 programmable cell-states, the method comprising:
   applying to each cell at least one initial voltage and making a measurement indicative of cell current due to the respective at least one initial voltage;
   calculating a value of a read voltage for the cell using a sum of a value of one of the at least one initial voltage and a value of a function based on the measurement associated with each at least one initial voltage;
   applying the read voltage to the cell;
   making a read measurement indicative of cell current due to the read voltage; and
   outputting a cell-state metric dependent on the read measurement.

2. The method of claim 1, further comprising outputting the read measurement as the cell-state metric.

3. The method of claim 1, wherein the cell-state metric is dependent on the read measurement and the measurement indicative of cell current due to the initial voltage.

4. The method of claim 1, wherein the read voltages are determined such that the cell-state metric provides a larger programming window than that for the measurement indicative of cell current due to the initial voltage.

5. The method of claim 1, wherein the read voltages are determined such that the cell-state metric compensates for drift of the cell-states.

6. The method of claim 1, wherein the calculating the value of the read voltage is based on a predetermined function of the measurement.

7. The method of claim 1, wherein a single initial voltage is applied to the cell.

8. The method of claim 1, further comprising detecting the programmed cell-state for each cell in dependence on the cell-state metric.

9. An iterative programming method for resistive memory cells having s≥2 programmable cell-states, wherein read measurement of the cells during programming is performed by a method as claimed in claim 1.

10. The method of claim 1, wherein s>2.

11. The method of claim 4, wherein the cell-state metric provides a programming curve indicating the larger programming window.

12. The method of claim 7, further comprising making a single measurement indicative of cell current due to the initial voltage.

13. The method of claim 7, wherein the read voltage is dependent on the difference between the measurement and a predetermined reference value.

14. The method of claim 13, wherein the calculating the value of the read voltage is based on the initial voltage and the difference.

15. A method for read measurement of resistive memory cells having s≥2 programmable cell-states, the method comprising:
   applying to each cell at least one initial voltage and making a measurement indicative of cell current due to the respective at least one initial voltage;
   calculating a value of a read voltage for the cell using a sum of a value of one of the at least one initial voltage and a value of a function based on the measurement associated with each at least one initial voltage;
   applying the read voltage to the cell;
   making a read measurement indicative of cell current due to the read voltage; and
   outputting a cell-state metric dependent on the read measurement, wherein the function is selected to result in the value of the read voltage being different for different cell-state metrics.

* * * * *